US011088399B2

(12) United States Patent
Ruehle et al.

(10) Patent No.: US 11,088,399 B2
(45) Date of Patent: Aug. 10, 2021

(54) CURRENT SENSOR AND BATTERY COMPRISING SUCH A CURRENT SENSOR

(71) Applicant: Robert Bosch GmbH, Stuttgart (DE)

(72) Inventors: Andreas Ruehle, Bietigheim-Bissingen (DE); Chrysanthos Tzivanopoulos, Remseck am Neckar (DE); Eduard Reimer, Fellbach (DE); Karsten Thoelmann, Moeglingen (DE); Kuen Cheuk Leung, Rochester Hills, MI (US); Lisa Lorenz, Stuttgart (DE); Patrick Kaupp, Stuttgart (DE); Sven Bergmann, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 550 days.

(21) Appl. No.: 15/779,783

(22) PCT Filed: Nov. 18, 2016

(86) PCT No.: PCT/EP2016/078092
§ 371 (c)(1),
(2) Date: May 29, 2018

(87) PCT Pub. No.: WO2017/089228
PCT Pub. Date: Jun. 1, 2017

(65) Prior Publication Data
US 2020/0303784 A1    Sep. 24, 2020

(30) Foreign Application Priority Data
Nov. 27, 2015   (DE) .................. 10 2015 223 526

(51) Int. Cl.
*H01M 10/42* (2006.01)
*G01R 19/32* (2006.01)
(Continued)

(52) U.S. Cl.
CPC .......... *H01M 10/425* (2013.01); *G01R 19/32* (2013.01); *H05K 1/181* (2013.01); *G01R 1/203* (2013.01);
(Continued)

(58) Field of Classification Search
CPC .................... G01R 19/32; G01R 1/203; H05K 2201/10151; Y02E 60/10
See application file for complete search history.

(56) References Cited

U.S. PATENT DOCUMENTS 6,028,426 A    2/2000  Cameron et al.
6,121,766 A *  9/2000  Beardmore ............ G01R 19/03
                                                324/105
(Continued)

FOREIGN PATENT DOCUMENTS

CN    102955132 A    3/2013
CN    103267775 A    8/2013
(Continued)

OTHER PUBLICATIONS

International Search Report and Written Opinion with English translation for Application No. PCT/EP2018/078092 dated Jan. 2, 2017 (22 pages).

*Primary Examiner* — Dominic E Hawkins
(74) *Attorney, Agent, or Firm* — Michael Best & Friedrich LLP

(57) ABSTRACT

The invention relates to a current sensor comprising an electric conductor (10), through which a first current (I) can flow parallel to a first direction (R1) and which comprises three regions (21, 22, 23) immediately following on from each other in the first direction (R1). A middle region (22) of the three regions (21, 22, 23) comprises a conductor cross-sectional area that is smaller than a conductor cross-sectional area of each of the two outer regions (21, 23) of the three regions (21, 22, 23). A voltage sensor of the current (Continued)

sensor is designed to measure a first voltage between the two terminals (41, 42) thereof. The first voltage is the same as a voltage applied to a measuring region (22, 25) at least partially coinciding with the middle region (22). An evaluation unit of the current sensor is designed to determine an existing current value of the first current (I) in accordance with an existing voltage value of the first voltage and a pre-defined resistance value of a first resistance of the measuring region (22, 25).

15 Claims, 5 Drawing Sheets

(51) Int. Cl.
*H05K 1/18* (2006.01)
*G01R 1/44* (2006.01)
*G01R 1/20* (2006.01)

(52) U.S. Cl.
CPC ...... *G01R 1/44* (2013.01); *H05K 2201/10151* (2013.01)

(56) References Cited

U.S. PATENT DOCUMENTS

| | | | | |
|---|---|---|---|---|
| 2012/0327973 A1* | 12/2012 | Hetzler | ............... | G01R 19/03 374/185 |
| 2014/0320150 A1* | 10/2014 | Sato | ............... | G01R 35/005 324/601 |

FOREIGN PATENT DOCUMENTS

| | | |
|---|---|---|
| CN | 103323486 A | 9/2013 |
| CN | 103512914 A | 1/2014 |
| DE | 102004042719 A1 | 9/2005 |
| DE | 102006001874 A1 | 7/2007 |
| DE | 102007033182 A1 | 1/2009 |
| DE | 102010009835 A1 | 9/2011 |
| DE | 102013210128 A1 | 9/2014 |
| DE | 102014103343 A1 | 9/2014 |
| EP | 2437072 A2 | 4/2012 |

\* cited by examiner

CURRENT SENSOR AND BATTERY COMPRISING SUCH A CURRENT SENSOR

BACKGROUND OF THE INVENTION

The present invention relates to a current sensor comprising a current conductor through which a first current can flow in parallel with a first direction. The invention also relates to a printed circuit board unit comprising a printed circuit board and a current sensor of this kind arranged on the printed circuit board. The invention further relates to a battery comprising a plurality of battery modules, which have in each case at least one battery cell, and at least one aforementioned current sensor. In this case, the battery preferably comprises at least one aforementioned printed circuit board unit comprising at least one printed circuit board on which the at least one current sensor is arranged.

The prior art discloses a current sensor comprising a current conductor through which a first current can flow in parallel with a first direction. In this case, the current sensor is configured to determine a present current value of the first current.

Document DE 10 2009 011 538 A1 discloses a printed circuit board unit, which comprises an adhesive composition. In this case, the adhesive composition has good electrical conductivity. The same document discloses electronic circuits, which are generally produced by applying a copper layer to a substrate.

Document DE 10 2008 061 051 A1 discloses a printed circuit board unit comprising an electrically conductive conductor track and an electronic component. In this case, the conductor tracks have a copper layer. Furthermore, the same document discloses a printed circuit board unit comprising an electronic component, which is connected to at least one electrically conductive conductor track of a printed circuit board of the printed circuit board unit by way of an adhesive composition.

Document DE 697 32 004 T2 discloses an adhesive tape or an adhesive film, which is suitable as an adhesive layer for a semiconductor-connecting substrate. In this case, the adhesive layer has a copper film for improved conductivity. The adhesive layer is used for mounting an integrated semiconductor circuit.

SUMMARY OF THE INVENTION

The invention provides a current sensor comprising a current conductor through which a first current can flow in parallel with a first direction. The current conductor comprises three regions directly following one another along the first direction. In this case, a central region of the three regions has a conductor cross-sectional area that is smaller than a conductor cross-sectional area of each of two outer regions of the three regions. A voltage sensor of the current sensor comprises two terminals and is configured to measure a first voltage applied between the two terminals. The two terminals are arranged in such a way that a minimum electrically conductive connection path between the two terminals runs partly across a measurement region and the first voltage is equal to a voltage dropped across the measurement region. In this case, the measurement area corresponds to the central region or to a subregion of the central region. Furthermore, an evaluation unit of the current sensor is configured to determine a present current value of the first current depending on a present voltage value of the first voltage and on a predefined resistance value of a first resistance of the measurement region.

According to a first development of the invention, the two outer regions comprise a respective other of two ends of the current conductor that extend perpendicularly to the first direction. In this case, each contact area between the central region and one of the two outer regions extends perpendicularly to the first direction. Furthermore, a conductor cross-sectional area of the current conductor along the first direction is discontinuous at each contact area.

According to a second preferred development of the invention, a quotient between the conductor cross-sectional area of the central region and the conductor cross-sectional area of each of the two outer regions is less than or equal to an integer multiple of 0.1 lying between 0.1 and 0.9. As an alternative or in addition, a quotient between a length of the central region extending in parallel with the first direction and the conductor cross-sectional area of the central region is less than a product between 1.6 and a reciprocal value of a first unit of length. In this case, a unit of length in which the length of the central region is given corresponds to the first unit of length. Furthermore, a unit of area in which the conductor cross-sectional area of the central region is given corresponds to the first unit of length squared. The second preferred development can be combined with the first preferred development and/or the configurations thereof.

According to a third preferred development of the invention, the current conductor is plate-shaped. As an alternative or in addition, a height profile of the current conductor along the first direction is constant. The third preferred development can be combined with one or more of the other preferred developments described above and/or the configurations thereof.

According to a fourth preferred development of the invention, the current conductor has a recess in an edge region running in parallel with the first direction, the contour of said recess consisting of three subcontours that directly follow one another. In this case, a first and a second of the subcontours each directly adjoin another of the two outer regions. Furthermore, a third of the subcontours runs in parallel with the first direction and directly adjoins the central region. The fourth preferred development can be combined with one or more of the other preferred developments described above and/or the configurations thereof.

In a current sensor described above according to the fourth preferred development, the first and/or the second subcontour preferably each run at least partly at an acute, right or obtuse angle with respect to the first direction. Each acute angle mentioned above can have, for example, an angle value that lies preferably between 45° and 90° and further preferably between 55° and 85°. Each obtuse angle mentioned above can have, for example, an angle value that lies preferably between 90° and 135° and further preferably between 95° and 130°. Furthermore, the first and/or the second subcontour can have in each case at least partly a linear profile. As an alternative or in addition, the first and/or the second subcontour can each have at least partly a curved profile.

In a current sensor described above, the conductor cross-sectional area of the central region of the current conductor and consequently also of the measurement region is smaller than the conductor cross-sectional area of each of the two outer regions of the current conductor. Consequently, the first resistance of the measurement region of a sensor described above is greater than in a case in which the conductor cross-sectional area of the measurement region is greater than or equal to the conductor cross-sectional area of each of the two outer regions of the current conductor. In this case, it is advantageous that an increase in the magnitude of the first resistance of the measurement region leads to an increase in the magnitude of voltage values of the voltage dropped across the measurement region and consequently to an increase in the magnitude of voltage values of the first voltage that are to be measured by means of the voltage sensor. In this case, the increase in the magnitude of the voltage values of the first voltage that are to be measured by means of the voltage sensor leads to a decrease of a relative measurement error of the voltage values of the first voltage that are to be measured by means of the voltage sensor.

According to a fifth preferred development of the invention, the measurement region corresponds to the central region. In this case, the two terminals are each arranged in another of the two outer regions. Furthermore, the minimum electrically conductive connection path between the two terminals runs entirely across the current conductor. As an alternative, the measurement region corresponds to the central region or to the subregion of the central region. In this case, the two terminals are arranged outside of the current conductor. Furthermore, parts of the minimum electrically conductive connection path that do not run across the measurement region are configured as measurement lines, which run outside of the current conductor. The fifth preferred development can be combined with one or more of the other preferred developments described above and/or the configurations thereof.

In a current sensor described above, the minimum electrically conductive connection path between the two terminals of the voltage sensor runs partly across the measurement region. Furthermore, the first voltage applied between the two terminals is equal to the voltage dropped across the measurement region. Consequently, no voltage is dropped across parts of the minimum connection path between the two terminals that do not run across the measurement region. This means that, in a case described above in which the two terminals are each arranged in another of the two outer regions of the current conductor, the parts of the minimum connection path between the terminals that do not run across the measurement region extend perpendicularly to the first direction. In order to be able to achieve this even when the conductor cross-sectional area of the current conductor is also discontinuous, the two terminals can be arranged in an edge subregion of a respective other of the two outer regions of the current conductor. In this case, the edge subregion of each outer region comprises a subarea of an area directly adjoining the central area of the respective outer region, said subarea directly adjoining an outer external environment of the current conductor. A current density of the first current occurring in each case in the edge subregions of the two outer regions is negligibly small. In particular, the current density of the first current occurring in each case in the edge subregions of the two outer regions is several orders of magnitude smaller than a current density of the first current occurring in other regions of the current conductor. Consequently, no current flows via the terminals arranged in the two edge subregions. Even in a case described above in which the two terminals are arranged outside of the current conductor, no current flows via the terminals, since in this case no voltage is dropped across the two measurement lines that extend outside of the current conductor. When no current flows via the two terminals, the current conductor and the terminals can advantageously also consist of two different materials, without an adverse effect on the two terminals, discussed below. For example, the terminals can consist of copper and the current conductor can consist of aluminum. The reason for the adverse effect is that, when the current conductor and the two terminals consist of two different materials, a current flowing via the two terminals can cause local melting of the terminals and consequently diffusion of the two different materials into one another.

According to a sixth preferred development of the invention, a current sensor described above comprises two temperature sensors in each case configured, in particular, as NTC thermistors. In this case, each of the temperature sensors is in thermal contact with in each case one end, which is associated with said temperature sensor, of two ends of the measurement region extending perpendicularly to the first direction. Furthermore, each temperature sensor is configured to measure a temperature of the end, which is associated with said temperature sensor, of the measurement region. The evaluation unit is also configured to determine the present current value of the first current depending on two parameters, which are each dependent on the present temperature value of the temperature measured by another of the temperature sensors. The sixth preferred development can be combined with one or more of the other preferred developments described above and/or the configurations thereof.

According to a seventh preferred development of the invention, the current conductor consists of a first material. In this case, the evaluation unit is configured to determine the present current value of the first current as a quotient between a present voltage value of a second voltage and a present resistance value of the first resistance. The evaluation unit is configured to set the present voltage value of the second voltage to be equal to the present value of the first voltage when the two terminals are arranged outside of the current conductor or when the two terminals are arranged inside the current conductor and consist of the first material. The evaluation unit is configured to determine the present voltage value of the second voltage depending on the present voltage value of the first voltage and the two parameters when the two terminals are arranged inside the current conductor and consist of a second material that is different to the first material. The evaluation unit is furthermore configured to determine the present resistance value of the first resistance depending on the predefined resistance of the first resistance and the two parameters. The seventh preferred development can be combined with one or more of the other preferred developments described above and/or the configurations thereof.

In a current sensor described above, the current conductor can be integrated into a circuit via its two outer regions. In this case, the two outer regions of the current conductor can have connections to the circuit that are configured differently in such a way that, when the first current flows through the circuit, temperatures of the two outer regions differ from one another significantly. Since the measurement region is in thermal contact with the two outer regions, the temperatures of the two ends of the measurement region extending perpendicularly to the first direction consequently also differ from one another in such a case. In a current sensor according to the sixth and/or seventh embodiment of the invention, the temperatures of the two ends of the measurement region mentioned above are measured by means of the two temperature sensors and taken into account in the determination of the present current value of the first current. As a result, the accuracy of the determination of the present current value of the first current is increased.

According to an eighth preferred development of the invention, the evaluation unit is configured, in a case in which the two terminals are arranged inside the current conductor and consist of the second material, to determine a present voltage value of a Seebeck thermoelectric voltage applied between the two ends of the measurement region. In this case, the evaluation unit is configured to determine the present voltage value of the Seebeck thermoelectric voltage applied between the two ends of the measurement region depending on Seebeck coefficients of the first and of the second material and on the two parameters. In this case, the evaluation unit is also configured to determine the present voltage value of the second voltage as a linear combination between the present voltage value of the first voltage and the present voltage value of the Seebeck thermoelectric voltage. The eighth preferred development can be combined with one or more of the other preferred developments described above and/or the configurations thereof.

In a current sensor according to the eighth embodiment of the invention, the Seebeck coefficients of the first and of the second material are also taken into account in the determination of the present current value of the first current when the two terminals are arranged inside the current conductor and consist of the second material. As a result, the accuracy of the determination of the present current value of the first current is further increased.

According to a ninth preferred development of the invention, the evaluation unit is configured to determine a temperature gradient occurring in the measurement region and to determine a present temperature value of an average temperature of the measurement region depending on the temperature gradient and the two parameters. Furthermore, the evaluation unit is configured to determine the present resistance value of the first resistance depending on the present and a predefined temperature value of the average temperature of the measurement region, on a temperature coefficient of the first material and the predefined resistance value of the first resistance value. In this case, the present resistance value of the first resistance corresponds to a resistance value of the first resistance occurring at the present temperature value of the average temperature of the measurement region. Furthermore, the predefined resistance value of the first resistance corresponds to the resistance value of the first resistance occurring at the predefined temperature value of the average temperature of the measurement region. The ninth preferred development can be combined with one or more of the other preferred developments described above and/or the configurations thereof.

In a current sensor according to the ninth embodiment of the invention, the temperature gradient occurring in the measurement region and the temperature coefficient of the first material are also taken into account in the determination of the present current value of the first current. As a result, the accuracy of the determination of the present current value of the first current is further increased.

In a current sensor according to a tenth embodiment of the invention, the evaluation unit is configured to determine a present temperature measurement error of each temperature sensor depending on a time-dependent present profile of the temperature measured by the respective temperature sensor and on a time-dependent present profile of a desired temperature. The desired temperature occurring in the determination of the present temperature measurement error of each temperature sensor is that temperature that would be measured by the respective temperature sensor in the absence of a thermal contact resistance between the respective temperature sensor and the end, which is associated with said temperature sensor, of the measurement region. The evaluation unit is further configured to determine, for each temperature sensor, a present temperature value of a corrected temperature of the end, which is associated with the respective temperature sensor, of the measurement region depending on the present temperature value of the temperature measured by the respective temperature sensor and on the present temperature measurement error of the respective temperature sensor. In this case, the two parameters each correspond to a present temperature value of the corrected temperature of a respective other of the ends, which are associated with the temperature sensors, of the measurement region. The tenth preferred development can be combined with one or more of the other preferred developments described above and/or the configurations thereof.

In a current sensor according to the tenth embodiment of the invention, present temperature measurement errors of the temperature sensors are also taken into account in the determination of the present current value of the first current. As a result, the accuracy of the determination of the present current value of the first current is further increased.

A current sensor described above can be arranged between two laminated polymer films or be produced as part of a lead frame.

A further aspect of the invention relates to a printed circuit board unit comprising a printed circuit board, a current sensor described above and a contact element. In this case, the current sensor is applied to the printed circuit board. Furthermore, the contact element is mounted on the printed circuit board. The contact element also has a strip of electrically conductive material, in particular of copper, and a double-sided bonding apparatus comprising two opposite bonding areas. Furthermore, the strip is connected to a first of the two outer regions of the current conductor of the current sensor. Furthermore, the bonding apparatus is bonded onto the strip by means of a first of the two bonding areas. An adhesive used for the bonding apparatus is also formed from an electrically conductive material.

An advantage of the printed circuit board unit described above is that the current sensor applied to the printed circuit board can be integrated in a simple and cost-effective manner into a circuit, through which the first current can flow, by means of a second of the two bonding areas of the bonding apparatus.

Another aspect of the invention relates to a battery comprising a plurality of battery modules, which are connected in series and have in each case at least one battery cell, and at least one current sensor described above, which is in each case associated with one of the battery modules. Each of the at least one current sensor is connected by means of a first of the two outer regions of its current conductor to a battery cell terminal of a predetermined battery cell of the battery module associated therewith and by means of a second of the two outer regions of its current conductor to a connection terminal of the battery module associated therewith. In this case, the battery modules are connected to one another by means of their connection terminals. Furthermore, the first current can flow through the battery and the current conductor of each current sensor at the same time. In this case, each current sensor associated with one of the at least one battery module can be formed in one piece with the connection terminal of the battery module associated therewith. Each current sensor associated with a battery module of the at least one battery module can be formed as a separate individual piece, that is to say isolated from the connection terminal of the battery module associated therewith.

The battery described above preferably comprises at least one printed circuit board unit described above. In this case, each of the at least one printed circuit board unit is in each case associated with that one of the battery modules that is also associated with the current sensor applied to the printed circuit board of the respective printed circuit board unit. In this case, the contact element of each printed circuit board unit is bonded by means of a second of the two bonding areas of its bonding apparatus to the battery cell terminal of the predetermined battery cell of the battery module associated with the respective printed circuit board unit.

BRIEF DESCRIPTION OF THE DRAWINGS

Exemplary embodiments of the invention are described in detail below with reference to the appended drawings. The same reference signs are used in each case for identical components and parameters. Each component and each parameter are respectively introduced once and treated as already being known if repeated, irrespective of the drawing or exemplary embodiment to which a respectively corresponding part of the description in which the component in question or the parameter in question is repeated relates. In the drawings.

DETAILED DESCRIPTION

Figure 1:
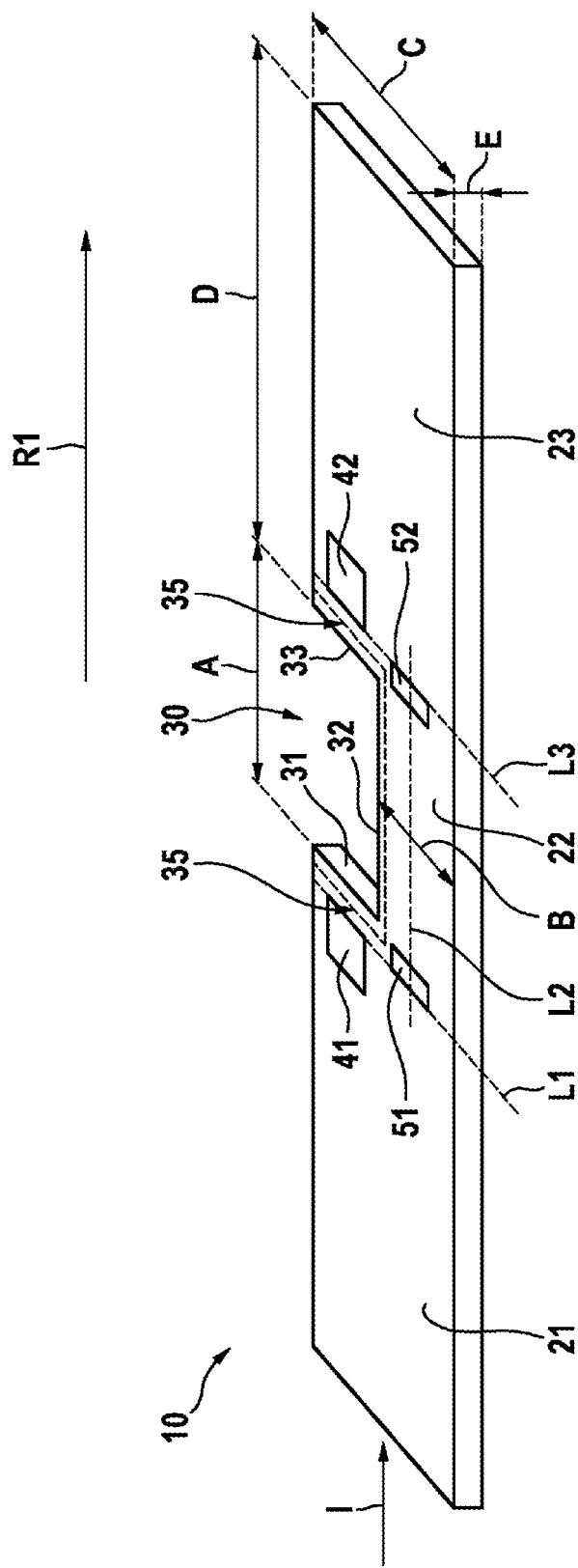
FIG. 1 shows a perspective view of a current conductor of a current sensor according to a first embodiment of the invention.

FIG. 1 shows a perspective view of a plate-shaped current conductor 10 of a current sensor according to a first embodiment of the invention. A first current I can flow through the current conductor 10 in parallel with a first direction R1. Consequently, the first current I can flow along the first direction R1. As an alternative, the first current I can flow opposite to the first direction R1. While flowing through the current conductor 10, the first current I can assume a maximum current value of, for example, 450 A over a time period with a duration of, for example, 10 s.

The current conductor 10 consists of a first material, for example of aluminum (AL3003 H18).

The current conductor 10 is plate-shaped and has a length that runs in parallel with the first direction R1. The current conductor 10 further comprises three regions 21, 22, 23, which comprise a central region 22 and two outer regions 21, 23 directly following one another along the first direction R1. In this case, the central region 22 directly adjoins a first outer region 21 and a second outer region 23. The two outer regions 21, 23 comprise a respective other of two ends of the current conductor 10 that extend perpendicularly to the first direction R1. Each contact area between the central region 22 and one of the two outer regions 21, 23 extends perpendicularly to the first direction R1. The outer regions 21, 23 each have an identical length D, which is different to a length A of the central region 22. The outer regions 21, 23 each have one and the same width C, which is different to a width B of the central region 22.

The current conductor 10 and consequently also the three regions 21, 22, 23 each have a constant height E.

The current conductor 10 comprises a U-shaped recess 30, the contour of which consists of three subcontours 31, 32, 33 directly following one another. The three subcontours 31, 32, 33 comprise a first subcontour 31 and a second subcontour 33, which each run perpendicularly to the first direction R1, and a third subcontour 32, which runs in parallel with the first direction R1. The first subcontour 31 directly adjoins the first outer region 21. The second subcontour 33 directly adjoins the second outer region 23. The third subcontour 32 directly adjoins the central region 22. Due to the presence of the recess 30, the width B of the central region 22 is significantly smaller than the width C of each outer region 21, 23. Consequently, a conductor cross-sectional area of the central region 22 is also significantly smaller than a conductor cross-sectional area of each outer region 21, 23.

A first relationship (1), given below, can exist, for example, between the length A of the central region 22, the width B of the central region 22 and the height E of the current conductor 10:

$$A/(B \cdot E) \leq 1.6 \cdot L0^{-1} \tag{1}$$

In the relationship (1), L0 denotes a first unit of length, which corresponds to a unit of length in which the length A of the central region 22, the width B of the central region 22 and the height E of the current conductor 10 are each given.

A second relationship (2), given below, can exist, for example, between the width C of each outer region 21, 23 and the length D of each outer region 21, 23:

$$C \leq 2 \cdot D \tag{2}$$

The current sensor according to the first embodiment comprises a voltage sensor, which has two terminals 41, 42 and is configured to measure a first voltage, which is applied between the two terminals 41, 42 and is dropped across a measurement region of the current conductor 10 at the same time. The current sensor further comprises an evaluation unit (not illustrated), which is configured to determine a present current value of the first current I depending on a present voltage value of the first voltage.

In the current sensor according to the first embodiment, the measurement region corresponds to the central region 22. For this reason, in the current sensor according to the first embodiment, the reference sign 22 is also used in the following text for the measurement region.

The two terminals 41, 42 can be made, for example, of a second material that is different to the first material, in particular can be made of copper.

The two terminals 41, 42 comprise a first terminal 41 arranged in the first outer region 21 and a second terminal 42 arranged in the second outer region 23. The two terminals 41, 42 are each arranged in an edge subregion of the respective outer region 21, 23, said edge subregion directly adjoining the recess 30, in such a way that a minimum electrically conductive connection path 35 between the two terminals 41, 42 directly adjoins the contour of the recess 30 and has one and the same length as the contour of the recess 30. Since the length A of the central region 22 is shorter than the length of the minimum electrically conductive connection path 35 between the terminals 41, 42, a geometric distance between the terminals 41, 42 is consequently also smaller than the length of the minimum electrically conductive connection path 35 between the terminals 41, 42.

A part of the minimum electrical connection path 35 between the two terminals 41, 42 runs along the central region 22 and extends in parallel with the first direction R1. Parts of the minimum electrical connection path 35 between the two terminals 41, 42 that do not run across the central region 22 run along the two outer regions 21, 23 and extend perpendicularly to the first direction R1. For this reason, the first voltage applied between the two terminals 41, 42 is equal to a voltage dropped across the central region 22 and consequently also across the measurement region 22.

A current density of the first current I, which current density occurs in the edge subregions of the two outer regions 21, 23, said edge subregions comprising the two terminals 41, 42, is substantially lower than a current density that occurs elsewhere in the current conductor 10. The current density of the first current I occurring in said edge subregions can be, for example, four to five orders of magnitude lower than the current density occurring elsewhere in the current conductor 10. Consequently, no current flows via the two terminals 41, 42, as a result of which local melting of the terminals 41, 42 and diffusion of the first and the second material into one another arising in the process are prevented.

The presence of the recess 30 results in a situation in which the conductor cross-sectional area of the central region 22 is significantly smaller than the conductor cross-sectional area of each outer region 21, 23. Consequently, the presence of the recess 30 results in a situation in which the first resistance of the central region 22 is significantly greater than a resistance of the central region 22 that would arise in a case in which the current conductor 10 does not have a recess 30. An increase in the magnitude of the first resistance leads to an increase in the magnitude of voltage values of the first voltage that are to be measured by means of the voltage sensor and consequently also to a reduction of a relative measurement error of the voltage values of the first voltage to be measured, said measurement error resulting on account of a limited resolution of the voltage sensor. In order to achieve optimum values of the voltage values of the first voltage that are to be measured, resistance values of the first resistance that are, for example, between $70 \cdot 10^{-6} \Omega$ and $400 \cdot 10^{-6} \Omega$ are required. In order to achieve minimum values of the voltage values of the first voltage to be measured, which can still be measured to a certain degree of accuracy, resistance values of the first resistance that are, for example, between $20 \cdot 10^{-6} \Omega$ and $50 \cdot 10^{-6} \Omega$ are required.

The current sensor according to the first embodiment comprises two temperature sensors 51, 52 in each case configured as NTC thermistors. Each of the two temperature sensors 51, 52 is in thermal contact with in each case one end, which is associated with said temperature sensor, of two ends of the measurement region 22 extending perpendicularly to the first direction R1 and is configured to measure a temperature of the end, which is associated with said temperature sensor, of the measurement region 22. Furthermore, the evaluation unit is also configured to determine a present current value of the first current I depending on present temperature values of the temperatures measured by means of the temperature sensors 51, 52 and on present temperature measurement errors of the two temperature sensors 51, 52. Each temperature sensor 51, 52 can measure a temperature that can assume a minimum temperature value of, for example, 0° C., that is to say 273.15 K, and a maximum temperature value of, for example, 110° C., that is to say 383.15 K.

The two temperature sensors 51, 52 comprise a first temperature sensor 51 and a second temperature sensor 52. The first temperature sensor 51 is arranged at an interface between a first line L1 and a second line L2. The first line L1 runs along the first outer region 21 in parallel with the width C of said first outer region and adjoins an edge region of the first terminal 41, which edge region faces the recess 30. The second line L2 runs along the central region 22 in parallel with the length A of said central region and divides the width B of the central region 22 into two subwidths, the length ratio of which is, in particular, 1. In this case, the length ratio of the two subwidths can differ from 1 by at most 20%. The second temperature sensor 52 is arranged at an interface between the second line L2 and a third line L3. The third line L3 runs along the second outer region 23 in parallel with the width C of said second outer region and adjoins an edge region of the second terminal 42, which edge region faces the recess 30. A manner of arranging the two temperature sensors 51, 52, which is described above, results in a situation in which each temperature sensor 51, 52 is in thermal contact with one end, which is associated with said temperature sensor, of two ends of the central region 22 that extend perpendicularly to the first direction and consequently with the end, which is associated with said temperature sensor, of the measurement region 22. Consequently, a first end of the two ends of the measurement region 22 is associated with the first temperature sensor 51 and a second end of the two ends of the measurement region 22 is associated with the second temperature sensor 52.

A determination of the present temperature measurement error of each temperature sensor 51, 52 is described in more detail in the following text. It should be taken into account here that a thermal contact resistance between each temperature sensor 51, 52 and the end, which is associated with said temperature sensor, of the measurement region 22 is not equal to zero. It should also be taken into account here that, when the first current I flows through the current conductor 10, an actual temperature of each of the two ends of the measurement region 22 gradually increases.

Figure 2:
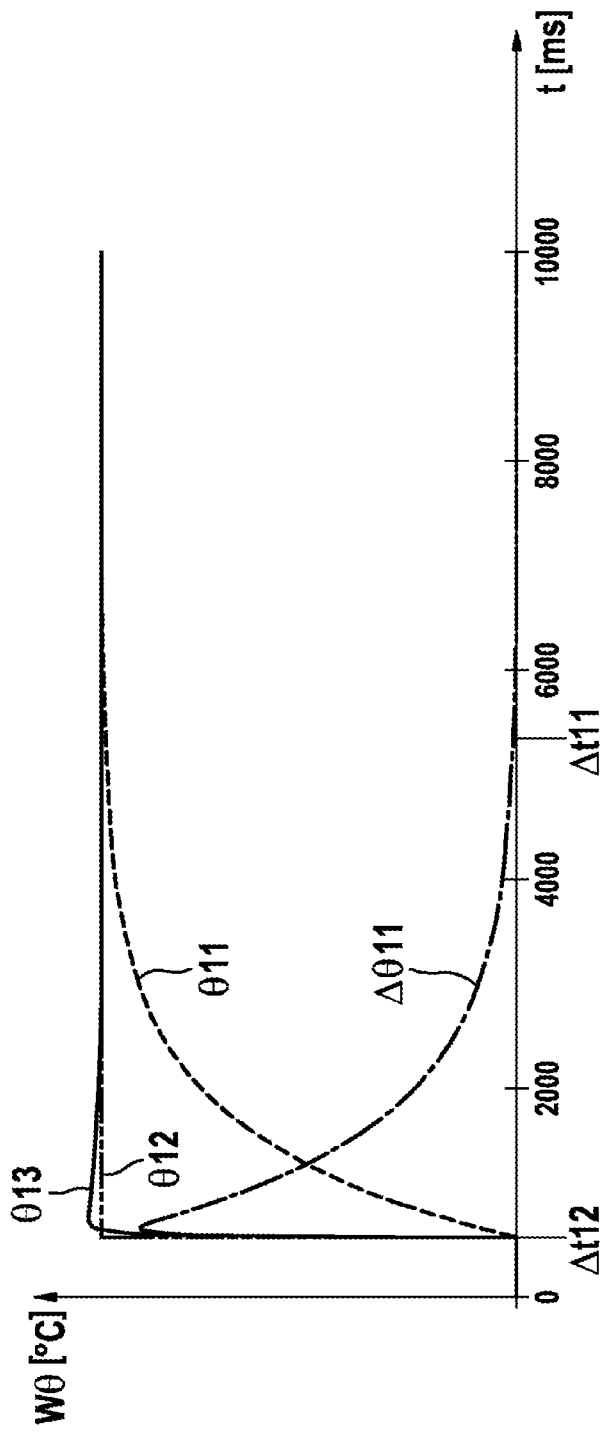
FIG. 2 shows a time-dependent profile of a first temperature, which is measured by means of a first temperature sensor of the current sensor according to the first embodiment, and further time-dependent temperature profiles.

A response of each temperature sensor 51, 52 that occurs when the first current I flows through the current conductor 10 is explained in more detail in the following text using the example of the first temperature sensor 51 and in connection with FIG. 2.

When the first current I flows through the current conductor 10, the first temperature sensor 51 will, during a first temperature measurement carried out by said first temperature sensor, measure a first temperature $\theta 11$ with a time-dependent profile. FIG. 2 shows the profile of the first temperature $\theta 11$ as a function of the time t measured in milliseconds. At an end of a first delay time period $\Delta t 11$ beginning at the same time as the first temperature measurement, the first temperature $\theta 11$ first assumes a present temperature value of the actual temperature of the first end, which is associated with the first temperature sensor 51, of the measurement region 22. An axis $W\theta$ featured in FIG. 2 gives temperature values in degrees Celsius.

Since the thermal contact resistance between the first temperature sensor 51 and the first end of the measurement region 22 is not equal to zero, the time-dependent profile of the first temperature $\theta 11$ is continuous during the first temperature measurement. If the thermal contact resistance between the first temperature sensor 51 and the first end of the measurement region 22 were equal to zero, during the first temperature measurement, the first temperature sensor 51 would measure a first desired temperature $\theta 12$ with a time-dependent discontinuous profile. FIG. 2 shows the profile of the first desired temperature θ12 as a function of the time t. At an end of a first reaction time period Δt12 beginning at the same time as the first temperature measurement and substantially shorter compared to the first delay time period Δt11, the first desired temperature θ12 would assume the present temperature value of the actual temperature of the first end of the measurement region 22. The first reaction time period Δt12 is a shortest time period, at the end of which the first temperature sensor 51 can specify a change in a temperature measured thereby. In this case, the profile of the first desired temperature θ12 at the end of the first reaction time period Δt12 is discontinuous and elsewhere during the first temperature measurement is continuous.

The profile of the first temperature θ11 and of the first desired temperature θ12 is constant during the first reaction time period Δt12. In this case, during the first reaction time period Δt12, the first temperature θ11 and the first desired temperature θ12 each have a constant temperature value of, for example, 0° C., that is to say 273.15 K. Furthermore, the profile of the first temperature θ11 directly after the end of the first reaction time Δt12 and before the end of the first delay time period Δt11 rises strictly monotonously with the time t. Furthermore, the profile of the first temperature θ11 is constant immediately after the end of the first delay time period Δt11. In this case, immediately after the end of the first delay time period Δt11, the first temperature θ11 has a constant temperature value that is equal to the present temperature value of the actual temperature of the first end of the measurement region 22. The profile of the first desired temperature θ12 immediately after the end of the first reaction time period Δt12 is also constant. In this case, the first desired temperature θ12 immediately after the end of the first reaction time period Δt12 has a constant temperature value that is equal to the present temperature value of the actual temperature of the first end of the measurement region 22.

In summary, during the first temperature measurement, the first temperature sensor 51 will measure the first temperature θ11 with a first present temperature measurement error Δθ11, which arises on account of the thermal contact resistance between the first temperature sensor 51 and the first end of the measurement region 22 that differs from zero. FIG. 2 shows a profile of the first present temperature measurement error Δθ11 as a function of the time t.

The first present temperature measurement error Δθ11 is determined as a function of the first temperature θ11 and the first desired temperature θ12 in such a way that a time-dependent profile of a sum between the first temperature θ11 and the first present temperature measurement error Δθ11 reproduces the time-dependent profile of the first desired temperature θ12 very well. In this case, the sum between the first temperature θ11 and the first present temperature measurement error Δθ11 is equal to a first corrected temperature θ13 of the first end of the measurement region 22. FIG. 2 shows a profile of the first corrected temperature θ13 as a function of the time t.

During the first temperature measurement, a plurality of temperature values of the first corrected temperature θ13 are measured at a plurality of sampling times immediately following one another. A third relationship (3), given below, exists between a present temperature value θ13n of the first corrected temperature θ13 and a further temperature value θ13m of the first corrected temperature θ13. In this case, the present temperature value θ13n of the first corrected temperature θ13 is present at a presently occurring sampling time tn of the plurality of sampling times. Furthermore, the further temperature value θ13m of the first corrected temperature θ13 is present at a further sampling time tm of the plurality of sampling times, which further sampling time occurs temporally immediately before the presently occurring sampling time tn.

$$\theta 13n = \theta 11n + k11 \cdot (\theta 11n - \theta 11m) - ((tn-tm)/k12) \cdot (\theta 13n - \theta 13m) \tag{3}$$

In the third relationship (3), k11 denotes a first correction factor and k12 denotes a second correction factor. These two correction factors k11, k12 are determined by means of the first present temperature measurement error Δθ11. In the relationship (3), θ11n denotes a present temperature value of the first temperature θ11, which is present at the presently occurring sampling time tn. In the relationship (3), θ11m denotes a further temperature value of the first temperature θ11, which is present at the further sampling time tm.

When the first current I flows through the current conductor 10, the second temperature sensor 52 will, during a second temperature measurement carried out by said second temperature sensor, measure a second temperature θ21 with a time-dependent profile. The second temperature measurement is effected at the same time as the first temperature measurement. In the second temperature measurement, a plurality of temperature values of the second temperature θ21 are measured at a plurality of sampling times immediately following one another, which correspond to the sampling times occurring in the first temperature measurement. In this case, during the second temperature measurement, the second temperature θ21, a present temperature value θ21n and a further temperature value θ21m of the second temperature θ21 and a second desired temperature θ22 are defined in the same manner as the corresponding first variables are defined in the first temperature measurement. Furthermore, during the second temperature measurement, a second present temperature measurement error Δθ21, a second corrected temperature θ23 of the second end of the measurement region 22, a present temperature value θ23n and a further temperature value θ23m of the second corrected temperature θ23 are also defined in the same manner as the corresponding first variables are defined in the first temperature measurement.

A fourth relationship (4), given below, exists between a present temperature value θ23n of the second corrected temperature θ23 and the further temperature value θ23m of the second corrected temperature θ23.

$$\theta 23n = \theta 21n + k21 \cdot (\theta 21n - \theta 21m) - ((tn-tm)/k22) \cdot (\theta 23n - \theta 23m) \tag{4}$$

In the fourth relationship (4), k21 denotes a further first correction factor and k22 denotes a further second correction factor. These two correction factors k21, k22 are determined by means of the second present temperature measurement error Δθ21. The first correction factor k11 and the further first correction factor k21 do not have units and can each have a value of 25. The second correction factor k12 and the further second correction factor k22 can each have a value of 40 ms, that is to say of $40 \cdot 10^{-3}$ s.

The evaluation unit of the current sensor according to the first embodiment of the invention is configured to determine the first present temperature measurement error Δθ11, as described above, by means of the first temperature θ11 and the first desired temperature θ12. The evaluation unit of the current sensor according to the first embodiment of the invention is further configured to determine the second present temperature measurement error Δθ21, as described above, by means of the second temperature θ21 and the second desired temperature Δθ22. The evaluation unit is furthermore configured to determine the first correction factor k11 and the second correction factor k12 by means of the first present temperature measurement error Δθ11. The evaluation unit is also configured to determine the further first correction factor k21 and the further second correction factor k22 by means of the second present temperature measurement error Δθ21. The evaluation unit is further configured to determine the present temperature value θ13n of the first corrected temperature θ13 according to relationship (3) and the present temperature value θ23n of the second corrected temperature θ23 according to relationship (4).

The evaluation unit is also furthermore configured to determine a temperature gradient occurring in the measurement region 22 and to determine a constant factor K by means of the temperature gradient. The evaluation unit is also configured to determine a present temperature value θM1 of an average temperature θM of the measurement region 22 according to a fifth relationship (5), given below. According to the fifth relationship (5), the present temperature value θM1 of the average temperature θM of the measurement region 22 is determined as a function of the constant factor K and the present temperature values θ13n, θ23n of the first and the second corrected temperature θ13, θ23.

$$\theta M1 = (K/2) \cdot (\theta 13n + \theta 23n) \quad (5)$$

The evaluation unit is further configured to determine a present resistance value R1 of a first resistance R of the measurement region 22 according to a sixth relationship (6), given below. According to the sixth relationship (6), the present resistance value R1 of the first resistance R is determined as a function of the present temperature value θM1 and a predefined temperature value θM2 of the average temperature θM of the measurement region 22, of a temperature coefficient Kθ of the first material of the measurement region 22 and of a predefined resistance value R2 of the first resistance R.

$$R1 = R2 \cdot (1 + K\theta \cdot (\theta M1 - \theta M2)) \quad (6)$$

The predefined temperature value θM2 of the average temperature θM of the measurement region 22 can have a value of, for example, 25° C., that is to say 298.15 K. The temperature coefficient Kθ of the first material can have, for example, a value of less than 0.0023 K$^{-1}$. A relative change ΔKθ/Kθ of the temperature coefficient Kθ of the first material per Kelvin can satisfy, for example, the inequality 0.99 ≤ ΔKθ/Kθ ≤ 1.01. The predefined resistance value R2 of the first resistance R can have, for example, a value of 70·10$^{-6}$Ω. A resistance value of the first resistance R, which occurs at a temperature value of the average temperature θM of the measurement region 22 of 110° C., that is to say 383.15 K, can have, for example, a value of 160·10$^{-6}$Ω.

When the two terminals 41, 42 consist of the second material, the evaluation unit is configured to determine a present voltage value US1 of a Seebeck thermoelectric voltage US applied between the two ends of the measurement region 22 according to a seventh relationship (7), given below. According to the seventh relationship (7), the present voltage value US1 of the Seebeck thermoelectric voltage US is determined as a function of a first Seebeck coefficient α1 of the first material of the current conductor 10, of a second Seebeck coefficient α2 of the second material of the two terminals 41, 42 of the voltage sensor and of the present temperature values θ13n, θ23n of the first and the second corrected temperature θ13, θ23.

$$US1 = (\alpha 2 - \alpha 1) \cdot (\theta 23n - \theta 13n) \quad (7)$$

In the seventh relationship (7), terms which are proportional to a square of a difference between the present temperature value θ23n of the second corrected temperature θ23 and the present temperature value θ13n of the first corrected temperature θ13 have been disregarded. The first Seebeck coefficient α1 can be a value of 3.5·10$^{-3}$ V/k. The second Seebeck coefficient a2 can be a value of 6.5·10$^{-3}$ V/k.

When the two terminals consist of the second material, the evaluation unit is configured to determine a present voltage value UK1 of a second voltage UK according to an eighth relationship (8), given below. The second voltage UK results through correction of the first voltage UM by means of the Seebeck thermoelectric voltage US and is equal to a product between the first current I and the first resistance R. According to the eighth relationship (8), the present voltage value UK1 of the second voltage UK is determined as a function of the present voltage value UM1 of the first voltage UM and the present voltage value US1 of the Seebeck thermoelectric voltage US.

$$UK1 = UM1 - US1 = UM1 - (\alpha 2 - \alpha 1) \cdot (\theta 23n - \theta 13n) \quad (8)$$

The seventh and eighth relationship (7), (8) hold true for a case in which the two terminals 41, 42 consist of the second material and in which the first current flows along the first direction R1. If the first current I were to flow here opposite to the first direction R1, the difference between the present temperature value θ23n of the second corrected temperature θ23 and the present temperature value θ13n of the first corrected temperature θ13 occurring in the seventh and eighth relationship (7), (8) would be afflicted with a negative sign.

When the two terminals consist of the second material, the evaluation unit is configured to determine the present current value I1 of the first current I according to a ninth relationship (9), given below. According to the ninth relationship (9), the present current value I1 of the first current I is determined as the quotient between the present voltage value UK1 of the second voltage UK and the present resistance value R1 of the first resistance R.

$$I1 = UK1/R1 \quad (9)$$

When the two terminals 41, 42 consist of the first material, the evaluation unit does not determine a Seebeck thermoelectric voltage and is configured to determine the present current value I1 of the first current I as the quotient between the present voltage value UM1 of the first voltage UM and the present resistance value R1 of the first resistance R.

Figure 3:
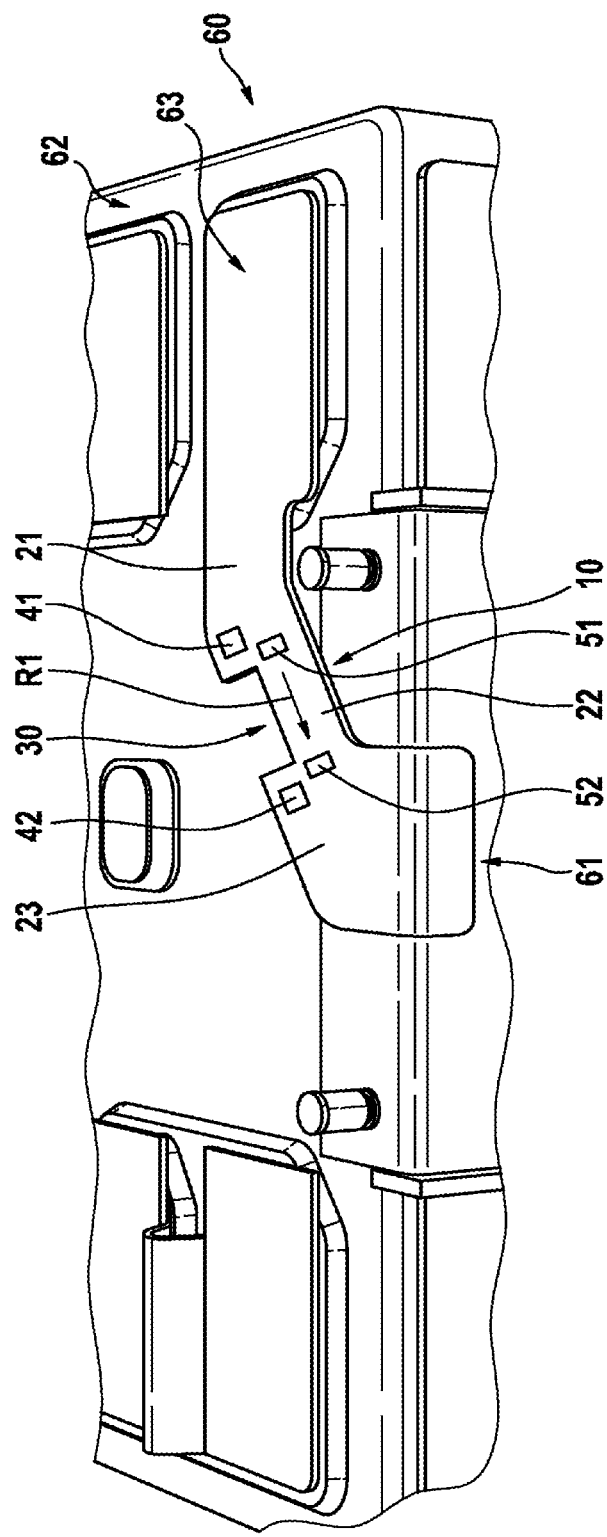
FIG. 3 shows a perspective partial view of a first battery module comprising a current sensor according to the first embodiment of the invention.

FIG. 3 shows a perspective partial view of a first battery module 60 comprising a plurality of battery cells, a current sensor according to the first embodiment of the invention and a first connection terminal 61. The battery cells of the first battery module are arranged in such a way that in each case one of two battery cell terminals of each of the battery cells is arranged inside an individual first area 62 of the first battery module 60. The first connection terminal 61 is arranged on a second area of the first battery module 60, said second area adjoining the first area 62 and running perpendicularly thereto. The first connection terminal 61 is also fixedly clamped or welded to the first battery module 60. To connect the first battery module 60 in series with at least one further first battery module (not illustrated), the first connection terminal 61 of the first battery module 60 can be connected to each further first connection terminal of the at least one further first battery module via a busbar or via an electrical cable. In this case, each further first connection terminal is configured in the same way and fitted to the respective further first battery module like the first connection terminal 61 is configured and fitted to the first battery module 60.

The current conductor 10 of the current sensor according to the first embodiment is connected by means of its first outer region 21 to a battery cell terminal 63 of a predetermined one of the battery cells of the first battery module 60, said battery cell terminal being arranged on the first area 62 of the first battery module 60, and by means of its second outer region 23 to the first connection terminal 61. To simplify the illustration of FIG. 3, only the battery cell terminal 63 of the predetermined battery cell, which battery cell terminal is connected to the current conductor 10, has been provided with the corresponding reference sign 63.

In the current conductor 10 shown in FIG. 3, that is to say in the current conductor 10 of the first battery module 60, the two outer regions 21, 23, the central region 22 corresponding to the measurement region 22, the recess 30, the two terminals 41, 42, which are configured, in particular, as protruding peaks, and the temperature sensors 51, 52 can be seen. The first current I can flow through the current conductor 10 of the first battery module 60 along the first direction R1 or counter to the first direction R1. Consequently, the first current I flowing through the current conductor 10 of the first battery module 60 can be a charging current or discharge current.

As described above, the two outer regions of the current conductor 10 of the first battery module 60 are connected to differently configured elements 63, 61, that is to say to the battery cell terminal 63 of the predetermined battery cell of the first battery module 60, said battery cell terminal being arranged inside the first area 62, and to the first connection terminal 61. For this reason, actual temperatures of the two outer regions 21, 23 of the current conductor 10 of the first battery module 60 and consequently also actual temperatures of the two ends of the corresponding measurement region 22 that extend perpendicularly to the first direction R1 are different. Depending on a design type of the predetermined battery cell of the first battery module 60 and of the first connection terminal 61, a difference between the actual temperatures of the two ends of said measurement region 22 can be, for example, between 10° C. and 100° C., that is to say between 10 K and 100 K. The design type of the predetermined battery cell of the first battery module 60 relates, in particular, to a capacitance of said battery cell. When the current conductor 10 of the first battery module 60 and the first connection terminal 61 are connected to one another by a material-bonded connection, such as, for example, welding or crimping, the difference between the actual temperatures of the two ends of the corresponding measurement region 22 is, for example, about 10° C. When the current conductor 10 of the first battery module 60 and the first connection terminal 61 are connected to one another by a plug connection, a resistance of a connecting point between the current conductor 10 of the first battery module 60 and the first connection terminal 61 is greater than when using a material-bonded connection. Consequently, in such a case, the difference between the actual temperatures of the two ends of the corresponding measurement region 22 is also greater.

Figure 4:
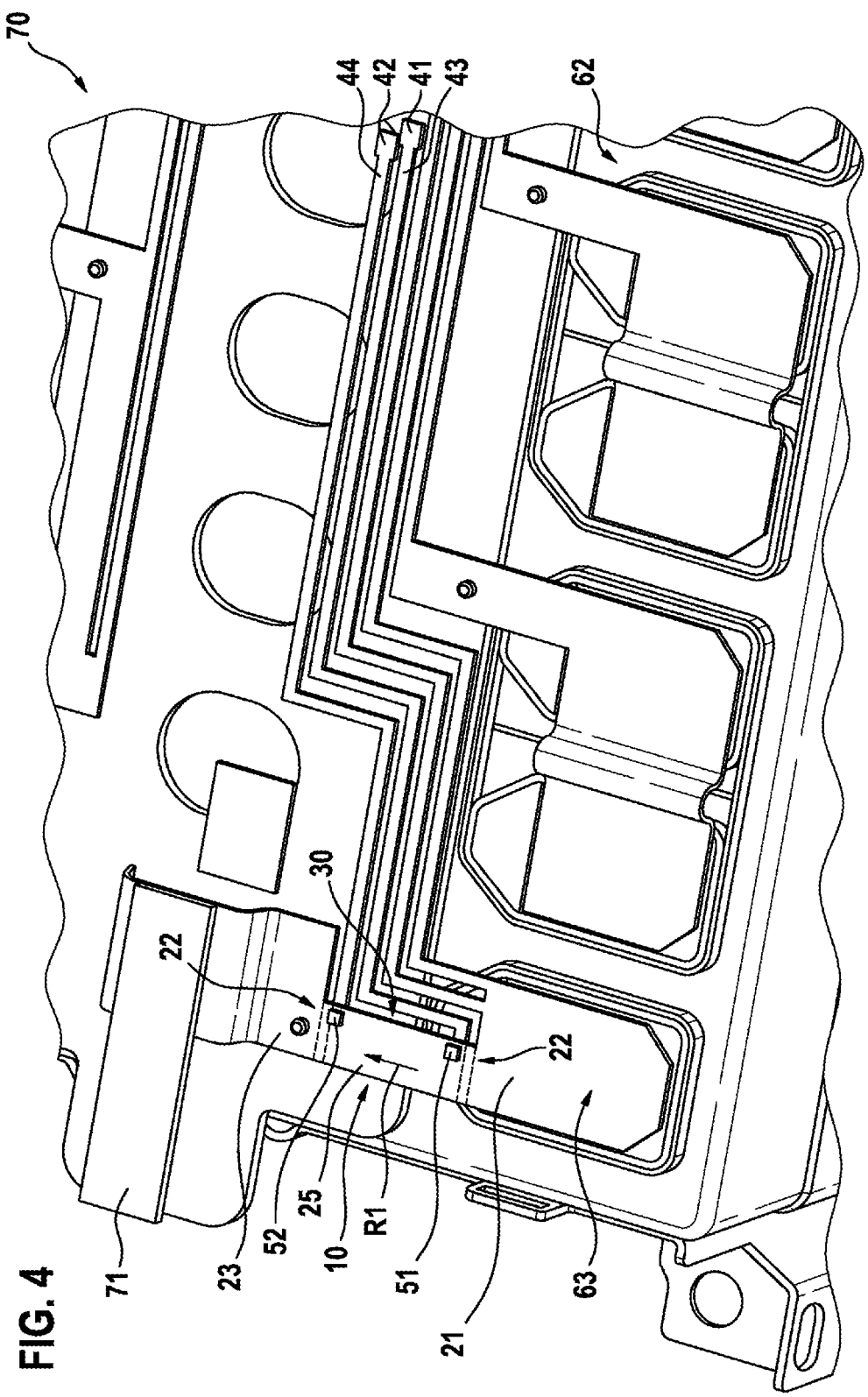
FIG. 4 shows a perspective partial view of a second battery module comprising a current sensor according to a second embodiment of the invention.

FIG. 4 shows a perspective partial view of a second battery module 70 comprising a current sensor according to the second embodiment of the invention and a second connection terminal 71. The second battery module 70 differs from the first battery module 60 in a design type of the current sensor according to the second embodiment and in a design and application type of the second connection terminal 71. The second battery module 70 is otherwise configured in the same way as the first battery module 60.

The current sensors according to the first and the second embodiment differ by an arrangement type of the two terminals 41, 42 and the two temperature sensors 51, 52. The current sensor according to the second embodiment comprises a measurement region 25, which is defined differently to the measurement region 22 of the current sensor according to the first embodiment. The current sensor according to the second embodiment comprises an evaluation unit, the functionality of which is different to a functionality of the evaluation unit of the current sensor according to the first embodiment. The two current sensors are otherwise configured in the same way. The current conductor 10 of the current sensor according to the second embodiment is applied to the second battery module 70 in the same way as the current conductor 10 of the current sensor according to the first embodiment is also applied to the first battery module 60.

The second connection terminal 71 is arranged on the first area 62 of the second battery module 70. To connect the second battery module 70 in series with an adjacent further second battery module (not illustrated), the second connection terminal 71 can be connected by means of a plug connection to a further second connection terminal of the adjacent further second battery module. As an alternative, instead of said plug connection, a welded connection can be used. In this case, the further second connection terminal is configured and applied to the further second battery module in the same way as the second connection terminal 71 is configured and applied to the second battery module 70.

In the current sensor according to the second embodiment, the two terminals 41, 42 are arranged outside of the current conductor 10. Furthermore, the measurement region 25 of the current sensor according to the second embodiment corresponds to a subregion of the central region 22 of the current conductor 10. In this case, the first terminal 41 is connected by means of a first measurement line 43 to a first end of two ends of the measurement region 25 that extend perpendicularly to the first direction R1. Furthermore, the second terminal 42 is connected by means of a second measurement line 44 to a second end of the two ends of the measurement region 25.

In the current sensor according to the second embodiment, a minimum connection path between the two terminals 41, 42 runs via the two measurement lines 43, 44 and via the measurement region 25. A part of the minimum connection path between the two terminals 41, 42 that runs via the measurement region 25 extends in parallel with the first direction R1. Since no voltage is dropped across the measurement lines 43, 44, in the current sensor according to the second embodiment, a first voltage applied between the two terminals 41, 42 is also equal to a voltage dropped across the measurement region 25.

The first temperature sensor 51 is in thermal contact with a first end, which is associated with said temperature sensor, of the two ends of the measurement region 25. The second temperature sensor 52 is in thermal contact with a second end, which is associated with said temperature sensor, of the two ends of the measurement region 25. The temperature sensors 51, 52 are each arranged adjacent to the recess 30. This means that each temperature sensor 51, 52 is also configured here to measure a temperature of the end, which is associated with said temperature sensor, of the measurement region 25 of the current conductor 10.

In the current sensor according to the second embodiment, the current conductor 10 is not directly connected to the terminals 41, 42. In this case, the current conductor 10 is connected to the terminals 41, 42 via the two measurement lines 43, 44. This means that, in the second battery module 70, the terminals 41, 42 each have a temperature that is equal to a temperature of the second battery module 70 and different from each temperature of one of the two ends of the measurement region 25.

Since the temperatures of the two terminals 41, 42 are equal in the current sensor according to the second embodiment, no Seebeck thermoelectric voltage is applied between said two terminals 41, 42. In the current sensor according to the second embodiment, the first voltage is consequently equal to a product between the first current I and a present resistance value of a first resistance of the corresponding measurement region 25. The evaluation unit of the current sensor according to the second embodiment is configured to determine the present current value of the first current I as quotients between the present voltage value of the first voltage and a present resistance value of the first resistance of the corresponding measurement region 25. The evaluation unit of the current sensor according to the second embodiment is also configured to determine the first resistance of the measurement region 25 of the corresponding current sensor in the same way as the evaluation unit according to the first embodiment determines the present resistance value of the first resistance of the measurement region 22 of the corresponding current sensor.

Figure 5:
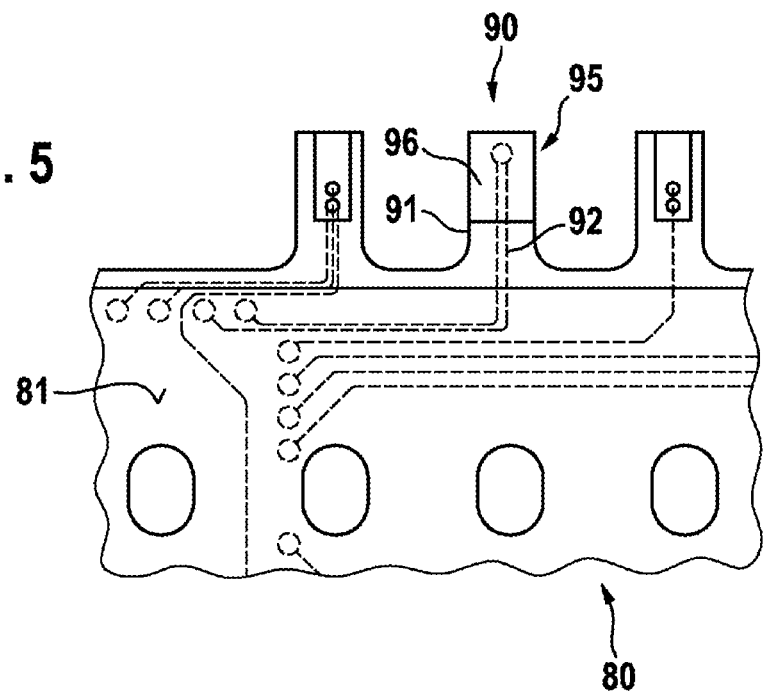
FIG. 5 shows a printed circuit board comprising a current sensor according to the first or the second embodiment of the invention.

FIG. 5 shows a partial rear view of a printed circuit board unit comprising a printed circuit board 80 formed, in particular, from flexible material, the rear-side area 81 of which is partially illustrated in FIG. 5. A current sensor (not illustrated) according to the first embodiment of the invention is mounted on a front-side area of the printed circuit board 80 running in parallel with the rear-side area 81. As an alternative thereto, a current sensor (not illustrated) according to the second embodiment of the invention can be mounted on the front-side area of the printed circuit board 80.

The printed circuit board unit comprises a contact element 90 comprising a carrier element 91, which is applied to a side area of the printed circuit board 80, said side area running perpendicular to the rear-side area 81 of the printed circuit board 80 and has two opposite areas. In this case, a rear-side area of the two opposite areas of the carrier element 91 adjoin the rear-side area 81 of the printed circuit board 80. Furthermore, a front-side area of the two opposite areas of the carrier element 91 adjoins the front-side area of the printed circuit board 80.

The contact element 90 furthermore comprises a strip 92 made of electrically conductive material. The strip 92 is mounted on the rear-side area of the carrier element 91. Furthermore, the strip 92 is connected to the first outer region 21 of the current conductor 10 of the current sensor mounted on the front-side area of the printed circuit board 80. The strip 92 can be formed, for example, of copper and applied by means of etching during production of the printed circuit board unit.

The contact element 90 further comprises a bonding apparatus 95 comprising two opposite bonding areas 96, which run in parallel with one another and comprise a first bonding area and a second bonding area 96. The bonding apparatus 95 is arranged on the rear-side area of the carrier element 91 and bonded onto the strip 92 by means of the first bonding area. In this case, an adhesive used for the bonding apparatus 95 is formed from an electrically conductive material. The bonding apparatus 95 is configured as a double-sided bonding tape. As an alternative thereto, to create the bonding apparatus 95, an electrically conductive adhesive can be spread on the strip 92 by means of a dispenser.

Figure 6:
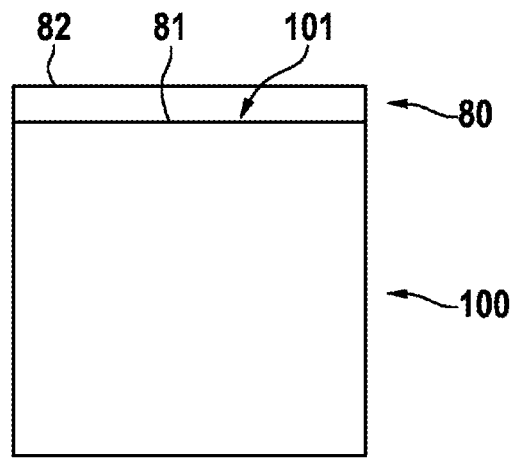
FIG. 6 shows a side view of a third battery module comprising a printed circuit board unit illustrated in FIG. 5.

FIG. 6 shows a side view of a third battery module 100 comprising a printed circuit board unit described above. The third battery module 100 further comprises a plurality of battery cells (not illustrated), which are arranged in such a way that in each case one of two battery cell terminals of each of the battery cells is arranged inside an individual first area 101 of the third battery module 100.

The printed circuit board unit is arranged in such a way that the rear-side area 81 of its printed circuit board 80 adjoins the first area 101 of the third battery module 100. In this case, the contact element 90 of the printed circuit board unit is bonded by means of the second bonding area 96 of its bonding apparatus 90 to a battery cell terminal of a predetermined one of the battery cells of the third battery module 100, said battery cell terminal being arranged on the first area 101 of the third battery module 100. As a result, the first outer region 21 of the current conductor 10 of the current sensor mounted on the front-side area 82 of the printed circuit board 80 is connected to the battery cell terminal of the predetermined battery cell of the third battery module 100, said battery cell terminal being arranged on the first area 101 of the third battery module 100.

The third battery module 100 comprises a third connection terminal (not illustrated), which is configured and applied to the third battery module 100 in the same way as the first connection terminal 61 is configured and applied to the first battery module 60. As an alternative, the third connection terminal can be configured and applied to the third battery module 100 in the same way as the second connection terminal 71 is configured and applied to the second battery module 70. Furthermore, the current conductor 10 of the current sensor mounted on the front area 82 of the printed circuit board 80 is connected by means of its second outer region 23 to the third connection terminal of the third battery module 100.

Besides the written disclosure above, reference is hereby additionally made to the illustration in FIGS. 1 to 6 for further disclosure of the invention.

The invention claimed is:

1. A current sensor comprising a current conductor (10) through which a first current (I) can flow in parallel with a first direction (R1), wherein the current conductor (10) comprises three regions (21, 22, 23) directly following one another along the first direction (R1), the three regions including two outer regions (21, 23) and a central region (22) between the two outer regions, wherein the central region (22) has a conductor cross-sectional area that is smaller than a conductor cross-sectional area of each of the two outer regions (21, 23), wherein a voltage sensor of the current sensor comprises two terminals (41, 42) and is configured to measure a first voltage applied between the two terminals (41, 42), wherein the two terminals (41, 42) are arranged in such a way that a minimum electrically conductive connection path (35) between the two terminals (41, 42) runs partly across a measurement region which corresponds to the central region (22) or to a subregion (25) of the central region (22), and the first voltage is equal to a voltage dropped across the measurement region, wherein an evaluation unit of the current sensor is configured to determine a present current value of the first current (I) depending on a present voltage value of the first voltage and on a predefined resistance value of a first resistance of the measurement region, further comprising two temperature sensors (51, 52), wherein each of the temperature sensors (51,

52) is in thermal contact with in each case one end, which is associated with said temperature sensor, of two ends of the measurement region extending perpendicularly to the first direction (R1) and is configured to measure a temperature (θ11) of the end, which is associated with said temperature sensor, of the measurement region, wherein the evaluation unit is also configured to determine the present current value of the first current (I) depending on two parameters, which are each dependent on the present temperature value of the temperature (θ11) measured by one of the temperature sensors (51, 52).

2. The current sensor as claimed in claim 1, characterized in that the two outer regions (21, 23) comprise a respective other of two ends of the current conductor (10) that extend perpendicularly to the first direction (R1) and each contact area between the central region (22) and one of the two outer regions (21, 23) extends perpendicularly to the first direction (R1), wherein a conductor cross-sectional area of the current conductor (10) along the first direction (R1) is discontinuous at each contact area.

3. The current sensor as claimed in claim 1, characterized in that a quotient between the conductor cross-sectional area of the central region (22) and the conductor cross-sectional area of each of the two outer regions (21, 23) is less than or equal to an integer multiple of 0.1 lying between 0.1 and 0.9 and/or a quotient between a length (A) of the central region (22) extending in parallel with the first direction (R1) and the conductor cross-sectional area of the central region (22) is less than a product between 1.6 and a reciprocal value of a first unit of length, wherein a unit of length in which the length (A) of the central region (22) is given corresponds to the first unit of length, and a unit of area in which the conductor cross-sectional area of the central region (22) is given corresponds to the first unit of length squared.

4. The current sensor as claimed in claim 1, characterized in that the current conductor (10) is plate-shaped and/or a height profile of the current conductor (10) along the first direction (R1) is constant.

5. The current sensor as claimed in claim 4, characterized in that the current conductor (10) has a recess (30) in an edge region running in parallel with the first direction (R1), the contour of said recess consisting of three subcontours (31, 32, 33) that directly follow one another, wherein a first and a second of the subcontours (31, 32, 33) each directly adjoin another of the two outer regions (21, 23) and a third of the subcontours (31, 32, 33) runs in parallel with the first direction (R1) and directly adjoins the central region (22).

6. The current sensor as claimed in claim 1, characterized in that the measurement region corresponds to the central region (22), the two terminals (41, 42) are each arranged in another of the two outer regions (21, 23) and the minimum electrically conductive connection path (35) between the two terminals (41, 42) runs entirely across the current conductor (10) or in that the measurement region (25) corresponds to the central region (22) or to the subregion (25) of the central region (22), the two terminals (41, 42) are arranged outside of the current conductor (10) and parts of the minimum electrically conductive connection path that do not run across the measurement region (25) are configured as measurement lines (43, 44), which run outside of the current conductor (10).

7. The current sensor as claimed in claim 1, characterized in that the current conductor (10) consists of a first material and the evaluation unit is configured to determine the present current value of the first current (I) as the quotient between a present voltage value of a second voltage and a present resistance value of the first resistance, wherein, when the two terminals (41, 42) are arranged outside of the current conductor (10) or when the two terminals (41, 42) are arranged inside the current conductor (10) and consist of the first material, the evaluation unit is configured to set the present voltage value of the second voltage to be equal to the present value of the first voltage and, when the two terminals (41, 42) are arranged inside the current conductor (10) and consist of a second material that is different to the first material, the evaluation unit is configured to determine the present voltage value of the second voltage depending on the present voltage value of the first voltage and the two parameters, wherein the evaluation unit is furthermore configured to determine the present resistance value of the first resistance depending on the predefined resistance of the first resistance and the two parameters.

8. The current sensor as claimed in claim 7, characterized in that, when the two terminals (41, 42) are arranged inside the current conductor (10) and consist of the second material, the evaluation unit is configured to determine a present voltage value of a Seebeck thermoelectric voltage applied between the two ends of the measurement region (22) depending on Seebeck coefficients of the first and of the second material and on the two parameters and to determine the present voltage value of the second voltage as a linear combination between the present voltage value of the first voltage and the present voltage value of the Seebeck thermoelectric voltage.

9. The current sensor as claimed in claim 7, characterized in that the evaluation unit is configured to determine a temperature gradient occurring in the measurement region, to determine a present temperature value of an average temperature of the measurement region depending on the temperature gradient and the two parameters and to determine the present resistance value of the first resistance depending on the present and a predefined temperature value of the average temperature of the measurement region, a temperature coefficient of the first material and the predefined resistance value of the first resistance, wherein the present resistance value of the first resistance corresponds to a resistance value of the first resistance occurring at the present temperature value of the average temperature of the measurement region and the predefined resistance value of the first resistance corresponds to a resistance value of the first resistance occurring at the predefined temperature value of the average temperature of the measurement region.

10. The current sensor as claimed in claim 1, characterized in that the evaluation unit is configured to determine a present temperature measurement error (Δθ11) of each temperature sensor (51, 52) depending on a time-dependent present profile of the temperature (θ11) measured by the respective temperature sensor (51, 52) and on a time-dependent present profile of a desired temperature (θ12), which would be measured by the respective temperature sensor (51, 52) in the absence of a thermal contact resistance between the respective temperature sensor (51, 52) and the end, which is associated with said temperature sensor, of the measurement region, wherein the evaluation unit is further configured to determine, for each temperature sensor (51, 52), a present temperature value of a corrected temperature (θ13) of the end, which is associated with the respective temperature sensor (51, 52), of the measurement region depending on the present temperature value of the temperature (θ11) measured by the respective temperature sensor (51, 52) and on the present temperature measurement error (Δθ11) of the respective temperature sensor (51, 52), wherein the two parameters each correspond to a present temperature value of the corrected temperature (θ13) of a respective other of the ends, which are associated with the temperature sensors (51, 52), of the measurement region.

11. A printed circuit board unit comprising a printed circuit board (80), a current sensor configured as claimed in claim 1 and a contact element (90), wherein the current sensor is applied to the printed circuit board (80) and the contact element (90) is mounted on the printed circuit board (80) and has a strip (92) of electrically conductive material, and a double-sided bonding apparatus (95) comprising two opposite bonding areas (96), wherein the strip (92) is connected to a first of the two outer regions (21, 23) of the current conductor (10) of the current sensor, the bonding apparatus (95) is bonded onto the strip (92) by means of a first of the two bonding areas (96) and an adhesive used for the bonding apparatus (95) is formed from an electrically conductive material.

12. A battery comprising a plurality of battery modules (60, 70, 100), which are connected in series and have in each case at least one battery cell, and at least one current sensor in each case associated with one of the battery modules (60, 70, 100) and in each case configured as claimed in claim 1, wherein each of the at least one current sensor is connected by means of a first of the two outer regions (21, 23) of a respective current conductor (10) to a battery cell terminal (63) of a predetermined battery cell of the battery module (60, 70, 100) associated therewith and by means of a second of the two outer regions (21, 23) of the respective current conductor (10) to a connection terminal (61, 71) of the battery module (60, 70, 100) associated therewith, wherein the battery modules (60, 70, 100) are connected to one another by means of respective connection terminals (61, 71) and the first current (I) can flow through the battery and at the same time through the current conductor (10) of each current sensor.

13. The battery as claimed in claim 12, characterized by at least one printed circuit board unit comprising a printed circuit board (80) with one of the at least one current sensor and a contact element (90), wherein the current sensor is applied to the printed circuit board (80) and the contact element (90) is mounted on the printed circuit board (80) and has a strip (92) of electrically conductive material, and a double-sided bonding apparatus (95) comprising two opposite bonding areas (96), wherein the strip (92) is connected to a first of the two outer regions (21, 23) of the current conductor (10) of the current sensor, the bonding apparatus (95) is bonded onto the strip (92) by means of a first of the two bonding areas (96) and an adhesive used for the bonding apparatus (95) is formed from an electrically conductive material, wherein each of the at least one printed circuit board unit is in each case associated with that one of the battery modules (100) that is also associated with the current sensor applied to the printed circuit board (80) of the respective printed circuit board unit, wherein the contact element (90) of each printed circuit board unit is bonded by means of a second of the two bonding areas (96) of its bonding apparatus (95) to the battery cell terminal of the predetermined battery cell of the battery module (100) associated with the respective printed circuit board unit.

14. The current sensor as claimed in claim 1, wherein the two temperature sensors (51, 52) are in each case configured as NTC thermistors.

15. A printed circuit board unit comprising a printed circuit board (80), a current sensor configured as claimed in claim 1 and a contact element (90), wherein the current sensor is applied to the printed circuit board (80) and the contact element (90) is mounted on the printed circuit board (80) and has a strip (92) of copper, and a double-sided bonding apparatus (95) comprising two opposite bonding areas (96), wherein the strip (92) is connected to a first of the two outer regions (21, 23) of the current conductor (10) of the current sensor, the bonding apparatus (95) is bonded onto the strip (92) by means of a first of the two bonding areas (96) and an adhesive used for the bonding apparatus (95) is formed from an electrically conductive material.

\* \* \* \* \*